United States Patent [19]

Boothroyd et al.

[11] Patent Number: 5,440,724
[45] Date of Patent: Aug. 8, 1995

[54] CENTRAL PROCESSING UNIT USING DUAL BASIC PROCESSING UNITS AND COMBINED RESULT BUS AND INCORPORATING MEANS FOR OBTAINING ACCESS TO INTERNAL BPU TEST SIGNALS

[75] Inventors: Donald C. Boothroyd, Phoenix; Bruce E. Flocken, Glendale, both of Ariz.

[73] Assignee: Bull HN Information Systems Inc.

[21] Appl. No.: 78,389

[22] Filed: Jun. 17, 1993

[51] Int. Cl.⁶ .................................. H04B 17/00
[52] U.S. Cl. ........................ 371/22.5; 371/22.1; 395/182.09; 395/448; 395/183.06
[58] Field of Search .............. 395/575; 371/16.1, 22.1, 371/15.1

[56] References Cited

U.S. PATENT DOCUMENTS

| | | | |
|---|---|---|---|
| 4,358,823 | 11/1982 | McDonald | 364/200 |
| 4,853,932 | 8/1989 | Nitschke | 371/68 |
| 5,053,953 | 10/1991 | Patel | 364/200 |
| 5,195,101 | 3/1993 | Guenthner | 371/68.3 |
| 5,249,187 | 9/1993 | Bruckert | 371/68.1 |
| 5,263,034 | 11/1993 | Guenthner | 371/68.3 |
| 5,274,797 | 12/1993 | Barlow | 395/575 |
| 5,276,862 | 1/1994 | McCulley | 395/575 |
| 5,276,891 | 1/1994 | Patel | 395/775 |
| 5,283,870 | 2/1994 | Joyce | 395/200 |

Primary Examiner—Robert W. Beausoliel, Jr.
Assistant Examiner—Glenn Snyder
Attorney, Agent, or Firm—J. S. Solakian; J. H. Phillips

[57] ABSTRACT

In order to validate data manipulation results in a CPU which incorporates duplicate BPUs for integrity, which BPUs are typically each implemented on a single VLSI circuit chip, and which is capable of performing single and double precision data manipulation operations, two cache units are employed. Each cache unit is dedicated to handling half-bytes of information and incorporates highly reliable data validating logic without the necessity for providing double word wide output busses from each BPU. This feature, which lowers the lead count to each VLSI chip, is obtained by dedicating each cache unit to handling half-bytes of information. Each cache unit includes bit-by-bit comparison circuitry to validate the half-byte results received from both BPUs in the case of single precision operations, and, in the case of double precision operation, one cache unit employs the same bit-by-bit comparison circuitry to validate, for both cache units, the result parity bits, and hence the half-byte results, received from both BPUs. In a single precision test mode of operation, test signals internal to the BPUs are issued in complementary half-bytes on the normally redundant result busses and are directed to an external logic analyzer or other test equipment for conventional analysis. In addition, when no stores are being made but the BPUs are manipulating data, the test signals may be furnished to the external test equipment in the same manner, the type of operation, single or double precision, being irrelevant.

3 Claims, 5 Drawing Sheets

SINGLE PRECISION
NORMAL OPERATION

DOUBLE PRECISION
NORMAL OPERATION

NONSTORING OPERATION TEST MODE

CENTRAL PROCESSING UNIT USING DUAL BASIC PROCESSING UNITS AND COMBINED RESULT BUS AND INCORPORATING MEANS FOR OBTAINING ACCESS TO INTERNAL BPU TEST SIGNALS

FIELD OF THE INVENTION

This invention relates to the art of data processing and, more particularly, to a central processing unit (CPU) using dual basic processing units (BPUs), dual cache units and a combined result bus to obtain a double word result while maintaining high data integrity and which further incorporates for accessing internal BPU test signals.

BACKGROUND OF THE INVENTION

Powerful and reliable mainframe CPUs may incorporate duplicate BPUs which work independently to execute the same instruction or instruction series in parallel such that the results can be compared to insure identity. It has now become feasible to incorporate an entire BPU on a single Very Large Scale Integrated (VLSI) circuit which has the advantage of not only occupying less space, but also enjoys the capability to run faster. However, there is a practical limit to the number of conductive leads which can be connected to a VLSI circuit, and this characteristic becomes a problem when double precision data manipulation is performed. This problem arises because each of the duplicate BPUs has typically required a double word result bus which, for example in one computer family in which the present application finds application, means the provision of two 80-bit result busses, one coupled to each BPU. Those skilled in the art will appreciate that it would be highly desirable to obtain reliable double precision results without the necessity to provide double word result buses from each of duplicate BPUs.

A related problem arises in accessing test signals within each BPU for dynamic analysis during operation. Again, the practical limitation on the number of conductive leads which can be connected to a VLSI circuit is a barrier to accessing such signals, but such access is essential. The present invention is directed to this end and to obtaining other desirable results which are a consequence of the implementation of the invention.

OBJECTS OF THE INVENTION

It is therefore a broad object of this invention to provide an improved CPU which incorporates duplicate BPUs for integrity, which BPUs are typically each implemented on a single VLSI circuit chip, and which is capable of performing single and double precision data manipulation operations and which includes provision for accessing internal BPU test signals.

It is a more specific object of this invention to provide a CPU incorporating duplicate BPUs and two cache units, each cache unit dedicated to handling half-bytes of information and incorporating highly reliable data validating logic without the necessity for providing double word wide output busses from each BPU, the CPU further incorporating means for accessing test signals within the BPUs during nonstoring operation and single precision cache store operation.

SUMMARY OF THE INVENTION

Briefly, these and other objects of the invention are achieved by providing a CPU incorporating duplicate BPUs and two cache units, each cache unit being dedicated to handling half-bytes of information. Each cache unit includes bit-by-bit comparison circuitry to validate the half-byte results received from both BPUs in the case of single precision operations, and, in the case of double precision operation, one cache unit employs the same bit-by-bit comparison circuitry to validate, for both cache units, the result parity bits, and hence the half-byte results, received from both BPUs. In a single precision test mode of operation, test signals internal to the BPUs are issued in complementary half-bytes on the normally redundant result busses and are directed to a logic analyzer or other test equipment for conventional analysis. In addition, when no stores are being made but the BPUs are manipulating data, the test signals may be furnished to the external test equipment in the same manner, the type of operation, single or double precision, being irrelevant.

DESCRIPTION OF THE DRAWING

The subject matter of the invention is particularly pointed out and distinctly claimed in the concluding portion of the specification. The invention, however, both as to organization and method of operation, may best be understood by reference to the following description taken in conjunction with the subjoined claims and the accompanying drawing of which:

DESCRIPTION OF THE PREFERRED EMBODIMENT(S)

Figure 1:
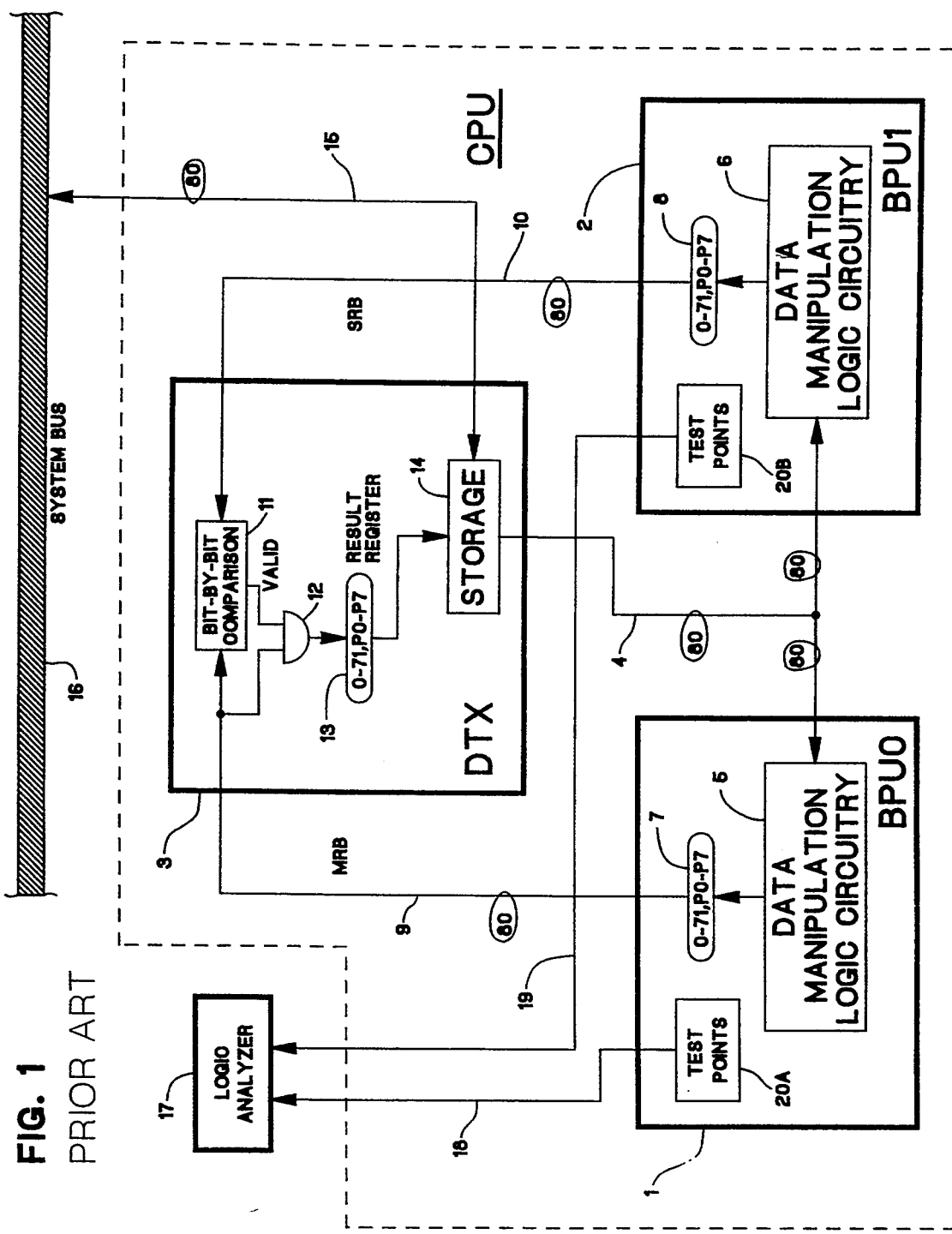
FIG. 1 is a block diagram of a typical prior art CPU incorporating duplicate BPUs and capable of performing single and double precision data manipulation and storing the validated results in a cache memory and including a logic analyzer for monitoring internal BPU test signals.

Referring first to FIG. 1, there is shown a block diagram of a typical prior art CPU incorporating duplicate BPUs which is capable of performing single and double precision data manipulation and storing the validated results in an internal cache memory. In the exemplary system, a data word is 36 bits wide, and each 9-bit data byte carries its own parity bit such that each full byte is 10 bits wide with the parity bit placed in the least significant bit position. Thus, a full single precision 4-byte word with parity information, a data word, consists of 40 bits, and a double precision 8-byte word, a double data word, consists of 80 bits.

A first BPU (BPU0) 1 may be deemed the "master" BPU, and a second BPU (BPU1) 2 is the "slave" BPU. In operation, both BPUs 1, 2 receive the same information from a cache unit (DTX) 3, via 80-bit wide BPU input bus 4, and perform the same operations in redundant fashion in their respective data manipulation logic circuitry blocks 5, 6. The results, which should be identical, appear in respective buffer registers 7, 8. In the case of single precision operations, depending upon a given CPU design, only half the buffer registers 7, 8 may be used, or the single precision results may be duplicated in the upper and lower halves of each of the buffer registers. In the case of double precision operations, of course, each double data word result consists of 80 bits wide. The master results are transferred to the cache unit 3 on master result bus (MRB) 9 while the slave results are similarly transferred to the cache unit on slave result bus (SRB) 10.

The results of each data manipulation operation, as obtained by each of the master and slave BPUs 1, 2, are compared, bit-by-bit, in comparison block 11 within the cache unit 3. (Bit-by-bit comparison circuits are well known in the art; for example, reference may be taken to the relevant disclosure, incorporated herein, in U.S. Pat. No. 5,195,101, the invention of which is assigned to the same Assignee as the subject invention.) If the results are identical, a "valid" signal issued by the comparison block 11 enables AND-gate array 12 to permit the master results to be transferred to result register 13 and thence to storage block 14. (It will be understood that if the results are invalid, appropriate error handling operations will be undertaken.) Information stored in or to be stored into the cache unit 3 may be made available to or received from other system components (e.g., other CPUs, I/O units, main memory, etc., not shown) via 80-bit wide input/output bus 15 and system bus 16 in the manner well known in the art.

Those skilled in the art will understand that access to internal BPU signals is required to diagnose complicated system problems in a dynamic environment during both system development and during troubleshooting. In the prior art, this has typically been achieved in the straightforward manner shown in FIG. 1 where internal BPU test signals represented by the blocks 20A, 20B have been directed to external logic analyzer 17 via test busses 18, 19, respectively. On the order of 20 test points are represented by each of the blocks 20A, 20B. The logic analyzer 17 is merely exemplary of the test equipment which can be employed to monitor and/or analyze the test signals. As well known in the art, a typical approach is to record the state of each test signal at each clock pulse. With this information captured very subtle problems can be detected and appropriate corrective action taken.

It will be observed that both the MRB and the SRB are 80-bits wide such that, if a BPU is implemented on a single VLSI chip, the configuration of FIG. 1, which is capable of high performance in carrying out both double precision and single precision data manipulation operations, may not be usable because of the practical limitation on the number of conductive connections, or I/O terminals, that can reliably be made on a single very dense and physically small VLSI chip. It will be apparent that the desirable accommodation of the test signals directed to the logic analyzer 17 becomes difficult or impossible in this prior art configuration.

Figure 2:
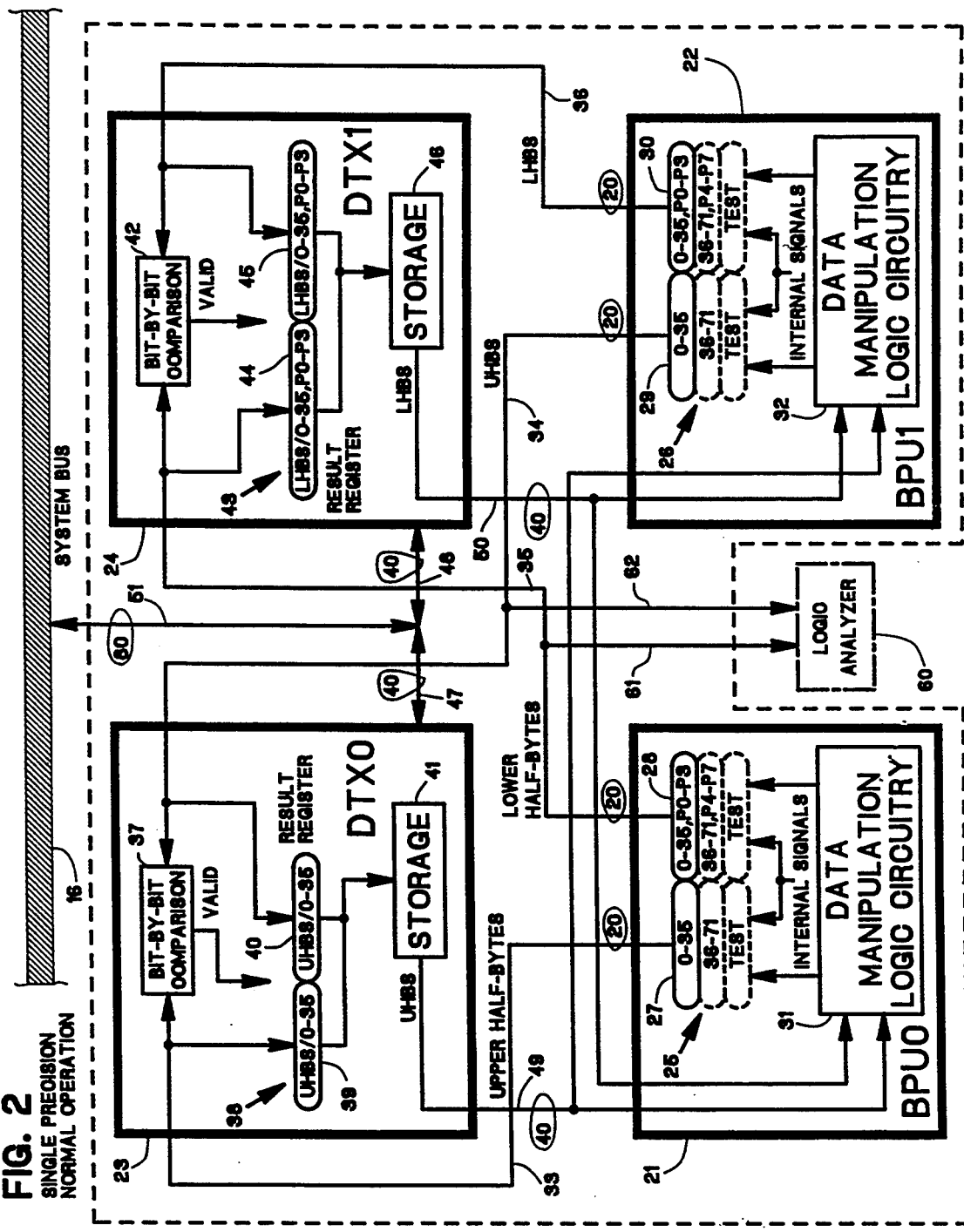
FIG. 2 is block diagram of a CPU according to the present invention shown configured to execute normal single precision data manipulation operations and cache stores.

Attention is now directed to FIG. 2 which illustrates in block diagram form the logic by which, according to the invention described and claimed in co-pending U.S. patent application Ser. No. 08/065105 entitled CENTRAL PROCESSING UNIT USING DUAL BASIC PROCESSING UNITS AND COMBINED RESULT BUS, the obstacle of insufficient result bus connection capacity is overcome in the performance of normal single precision data manipulation operations. In this configuration, BPU0 21 and BPU1 22 are not related as master and slave, but rather are peers which, however, receive identical information on which to perform data manipulations in a manner similar to that performed by the BPUs previously discussed and shown in the prior art configuration of FIG. 1. BPU0 21 and BPU1 22 each communicate with cache units DTX0 23 and DTX1 24. Each buffer multiplexer, 25, 26, respectively, receives the results of a given data manipulation performed by the respective logic blocks 31, 32 into upper half-byte sections 27, 29 and lower half-byte sections 28, 30. The upper half-bytes from the buffer register sections 27, 29 are transferred to the cache units 23, 24 via respective 20-bit wide UHB, or half a data word wide, result, busses 33, 34. Similarly, the lower half-bytes from the buffer register sections 28, 30 are transferred to the cache units 23, 24 via respective 20-bit wide LHB, or half a data word wide, result, busses 35, 36. Since, in the exemplary system, each data byte includes a parity bit in the least significant bit position, all the parity bits are resident in the lower half-bytes which are transferred to the cache unit 24.

For normal single precision operations, the exemplary system duplicates the results in the upper 27, 29 and lower 28, 30 halves of the buffer registers 25, 26 and in the cache units 23, 24. Those skilled in the art will understand that this design choice offers certain performance advantages that are not directly relevant to the present invention which is also adaptable to systems wherein only single, non-duplicated, word results are stored for single precision operations.

In the cache unit DTX0 23, the upper half-bytes from each of the BPU0 21 and BPU1 22 are compared for identity in the bit-by-bit comparison logic block 37 which issues a "valid" signal to transfer the data from BPUs 21, 22 into respective first 39 and second 40 halves of result register 38 and thence to storage block 41. Similarly, in the cache unit DTX1 24, the lower half-bytes from each of the BPU0 21 and BPU1 22 are compared for identity in the bit-by-bit comparison logic block 42 which issues a "valid" signal to transfer the data from BPUs 21, 22 into respective first 44 and second 45 halves of result register 43 and thence to storage block 46. (For simplicity, the AND-gate arrays which correspond to AND-gate array 12 shown in FIG. 1 and which are responsive to the "valid" signals have been omitted.)

Thus, at the end of a data manipulation operation, the results, having been compared for identity and found valid, will have been stored into cache storage with the upper half-bytes stored in duplicate in the storage block 41 in cache unit DTX0 23 and the lower half-bytes stored in duplicate in the storage block 46 of cache unit DTX1 24. 40-bit wide local input/output busses 47, 48 combine into 80-bit wide input/output bus 51 which is coupled to the system bus 16 for communication between the cache units 23, 24 with other system components. 40-bit wide cache-to-BPU busses 49, 50 are respectively used to transfer upper half-byte and lower half-byte data from the cache units 23, 24 to the BPUs 21, 22 for the subsequent performance of identical data manipulation operations.

It will be observed that, for single precision operations as illustrated in FIG. 2, the data output lines comprising the busses 33, 34 and 35, 36 from each of the BPUs 21, 22 to the cache units 23, 24 are only 40 lines, or one data word, rather than 80 lines, wide such that the line counts to and corresponding number of I/O terminals of the VLSI chips incorporating the BPUs are reduced accordingly.

According to the invention, internal test signals within each BPU are also made available to the buffer multiplexers 25, 26, and theses signals are selectively directable to a logic analyzer 60 or the like via busses 61, 62. However, during normal single precision operation as illustrated in FIG. 2, or when not operating in the test mode, these internal test signals are not passed through the multiplexers.

Figure 3:
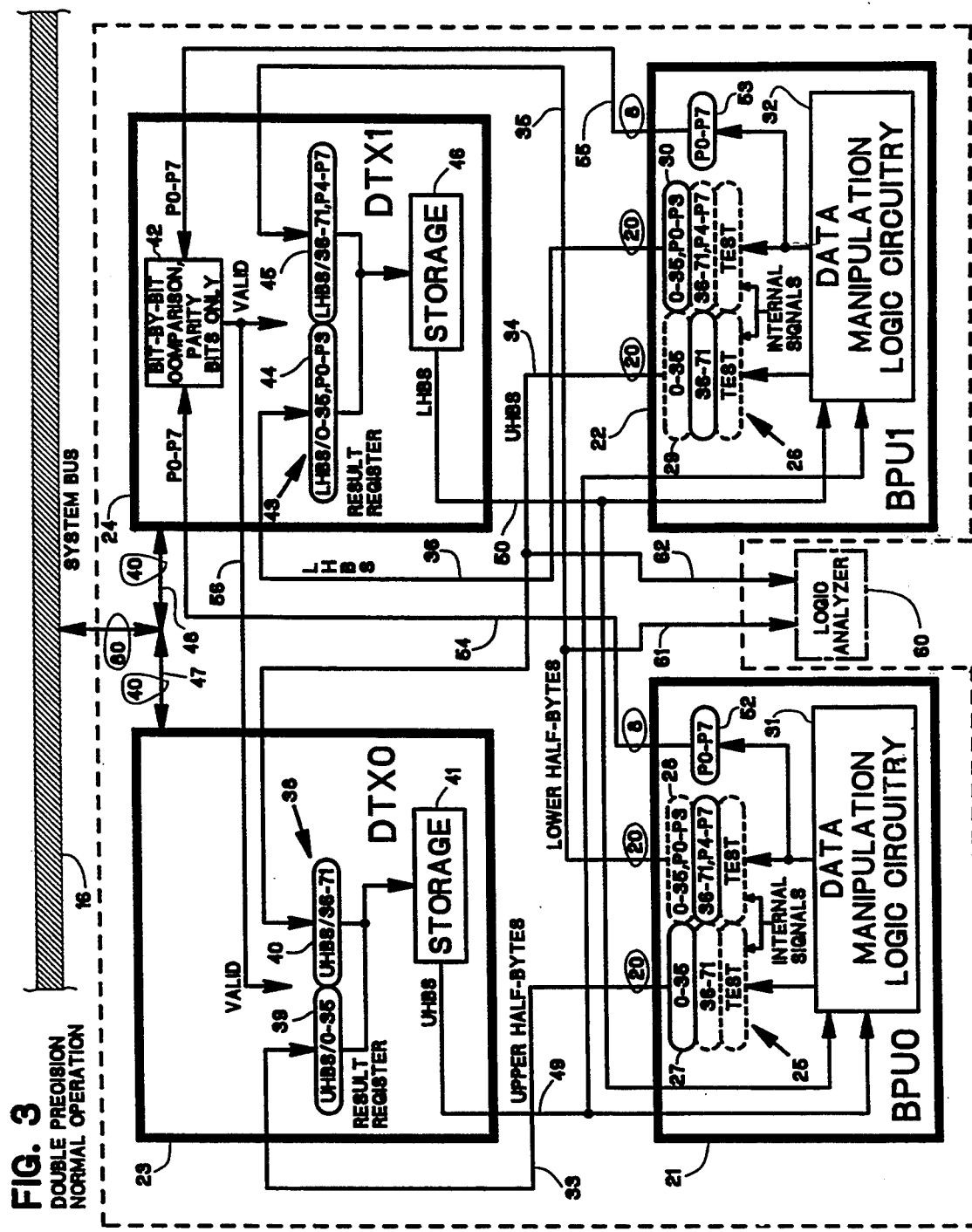
FIG. 3 is block diagram of a CPU according to the present invention shown configured to execute double precision data manipulation operations and cache stores.

Consider now the same apparatus as it performs double precision operations. Referring to FIG. 3, assume that the data manipulation blocks 31, 32 in the BPUs 21, 22 have been assigned a double precision operation. The double precision results will be placed in the buffer multiplexers 25, 26 such that: 1) the upper half-bytes of the low order word (data bits 0–35) are placed in the buffer register section 27 of the buffer multiplexer 25; 2) the upper half-bytes of the high order word (data bits 36–71) are placed in the buffer register section 29 of the buffer multiplexer 26; 3) the lower half-bytes (which include the parity bits) of the low order word (data bits 0–35) are placed in the buffer register section 28 of the buffer multiplexer 25; and the lower half-bytes (which include the parity bits) of the high order word (data bits 36–71) are placed in the parity buffer register section 30 of the buffer multiplexer 26. In addition, parity bit buffer registers 52, 53 in, respectively, the BPU0 21 and BPU1 22 receive the parity bits 0–7; i.e., each parity buffer register is loaded with a complete set of the parity bits present in the result generated by the data manipulation logic block resident in its BPU.

The complete sets of parity bits are respectively conveyed from the parity bit buffer registers 52, 53 to bit-by-bit comparison block 42 in cache unit DTX1 24 via parity busses 54, 55. If the two sets of parity bits are identical, the "valid" signal issues in the cache unit DTX1 24 to admit the lower half-bytes from each of the BPUs 21 and 22 into the result register 43 and thence to the storage block 46. In addition, this "valid" signal is coupled to the DTX0 23 by line 56 to enable the transfer of the upper half-bytes from each of the BPUs 21 and 22 into the result register 38 and thence to the storage block 41. Therefore, the complete, validated double precision result is stored in cache memory, the combination of the storage blocks 41 and 43, from which the data can be read to the BPUs 21 and 22 and/or the system bus 16 as previously described with respect to single precision operations.

In the case of double precision operations as illustrated in FIG. 3, the data output lines comprising the busses 33, 34, 54 and 35, 36, 55 from each of the BPUs 21, 22 to the cache units 23, 24 are 48 lines, rather than 80 lines, wide such that the line counts to the VLSI chips incorporating the BPUs are reduced accordingly. Since the same apparatus is employed for both single and double precision operations, it is this reduction from 80 to 48 output lines per BPU which represents the effective advantage over the prior art configuration. During double precision operation as illustrated in FIG. 3, the internal test signals are not passed through the multiplexers, or its test mode of operation is prohibited.

Figure 4:
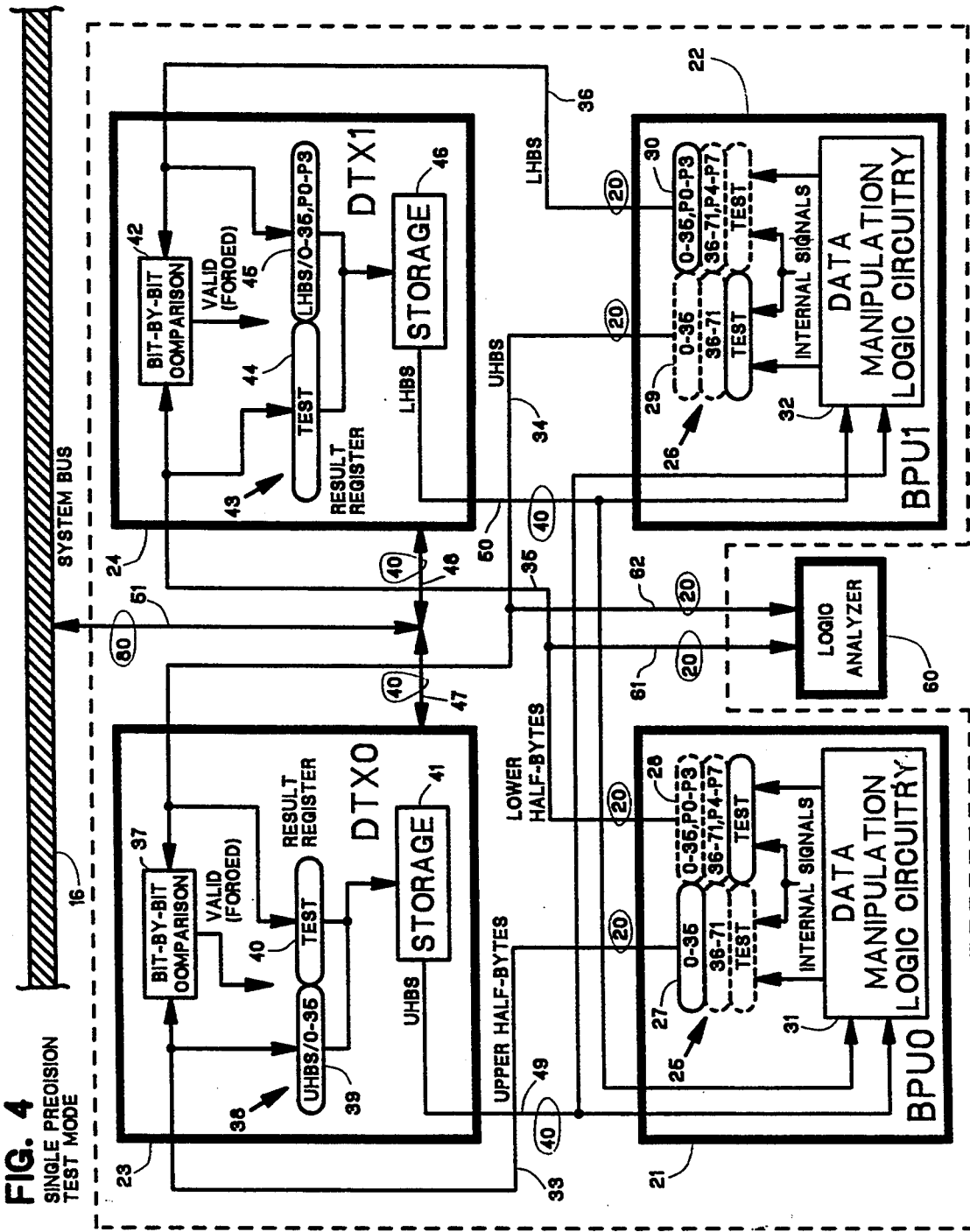
FIG. 4 is block diagram of a CPU according to the present invention shown configured to execute single precision data manipulation operations and cache stores in a test mode which permits access to internal BPU test signals by a logic analyzer.

FIG. 4 illustrates the exemplary embodiment of the invention operating in the single precision test mode by which the internal test signals in the BPUs 21, 22 are made available to the logic analyzer 60 while single precision operations are continued. In this mode of operation, the 0–35 upper haft byte inputs to the multiplexer section 27 in BPU0 21 are enabled to the result bus 33 for transfer to storage 41 in DTX0 23 via result register section 39. Similarly, the 0–35.P0–P3 lower half byte inputs to the multiplexer section 30 in BPU1 22 are enabled to the result bus 36 for transfer to storage 46 in DTX1 24 via result register section 45. Therefore, a complete, but not redundant, single precision result, including parity, is stored in cache and is available for subsequent use.

In addition and unique to the test mode of single precision operation, the a test (internal signal) lower half byte inputs to the multiplexer section 28 in BPU0 21 are enabled to the result bus 35 for transfer to the logic analyzer 60 via test bus 61. Similarly, the test upper half byte inputs to the multiplexer section 29 in BPU1 22 are enabled to the result bus 34 for transfer to the logic analyzer 60 via test bus 62. Optionally, the test signals appearing on the result busses 35, 34 may also be stored in cache storage via the result register sections 44, 40, respectively, for later use. Those skilled in the art will understand that while the test busses 61, 62, are shown as branches of the result busses 35, 34, the basic function is the transfer of the internal test signals by the multiplexers 25, 26, directly or indirectly, to the test busses for accessibility by the external test equipment.

It will be understood, therefore, that in test mode single precision operation according to the invention as shown by way of example in FIG. 4, the internal BPU test signals may be accessed by external test equipment notwithstanding the inherent limit on the number of conductive leads which can be coupled to a VLSI circuit. It will also be appreciated that, as VLSI technology improves, the two BPUs and the two cache units may be realizable on two or even one VLSI chip.

Figure 5:
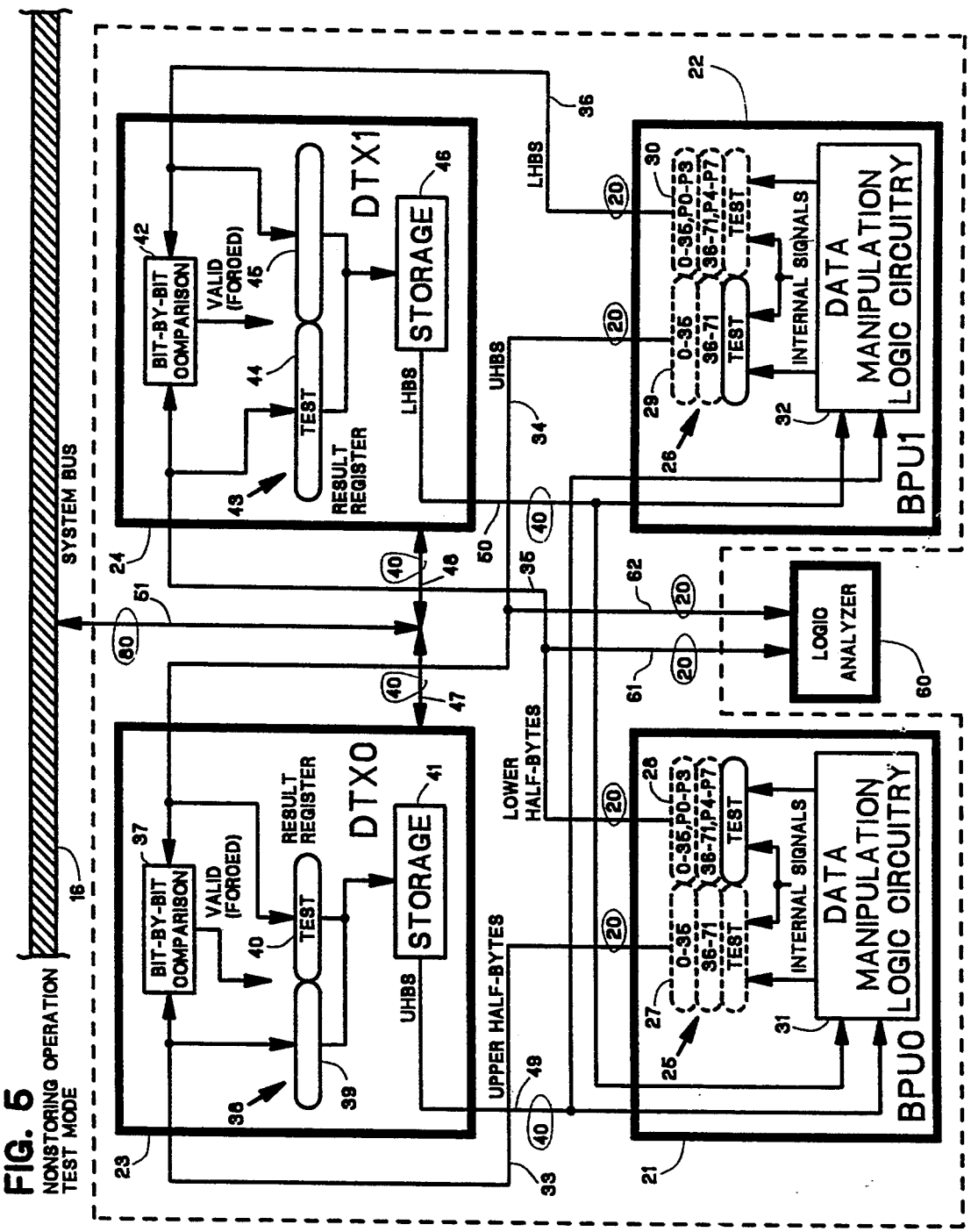
FIG. 5 is a block diagram of a CPU according to the present invention shown configured to execute single precision or double precision data manipulation operations without cache stores in another test mode which also permits access to internal BPU test signals by a logic analyzer.

Attention is now directed to FIG. 5 which illustrates the CPU in operation, either single precision or double precision, intermediate store-into-cache steps. As is well known in the art, most operations performed in a CPU do not require a store. The present invention takes advantage of this fact by providing for accessing the BPU internal signals during nonstoring operations by enabling for output only the test signals applied to the multiplexer sections 28, 29 of the multiplexers 25, 26. As a result, the internal signals may be observed step-by-step during nonstoring operations which account for most of operations performed by the CPU. This mode, of course, can be combined with the mode illustrated in FIG. 4 in which the test signals are accessible during single precision store operations which account for most of all store operations performed by the CPU. Therefore, it will be apparent that, during all CPU operations, the internal BPU test signals are accessible with the minor exception of during double precision store-into-cache steps. As a result, system debugging and troubleshooting is greatly facilitated, notwithstanding the inherent limitations on the number of conductive leads which can be coupled to a VLSI chip.

It will be noted that the test signals generated during nonstoring operations are also available on the busses 35, 36 if it is desired to store these signals in cache storage. Usually, however, this facility is provided in the external test equipment as exemplified by the logic analyzer 60, and storage of the test signals in cache is not necessary.

Thus, while the principles of the invention have now been made clear in an illustrative embodiment, there will be immediately obvious to those skilled in the art many modifications of structure, arrangements, proportions, the elements, materials, and components, used in the practice of the invention which are particularly adapted for specific environments and operating requirements without departing from those principles.

What is claimed is:

1. In a central processor including a first and a second basic processing unit (BPU), said first and second BPU's each being implemented on a single very large scale integrated (VLSI) chip on which the number of input /output terminals is limited, with each BPU chip executing the same computer instruction on the same data concurrently to produce the same result, said first and second BPU's being capable of performing single and double precision data manipulation operations, said BPU's producing a single data word of result signals when performing a single precision data manipulation operation and a double data word of result signals when performing a double precision operation and of storing the result signals of each such operation in a cache memory means, each of said first and second BPU's including a source of internal test signals; and a multiplexed data buffer register for selectively issuing signals of a single data word result, and a double data word result, said buffer register being divided into sections, a first section for temporarily storing signals of a data word result produced in executing a single precision data manipulation operation and signals of one data word of the result of the two data word result produced in executing a double precision data manipulation operation; and a second section for storing signals of the second data word of the two data word result produced in executing said double data precision data manipulation operation, each of said buffer register sections being divided into two half sections, with each half section storing the signals of a different half of the signals of the data word stored therein; a first and a second half a data word wide result bus for transmitting signals stored in different ones of said half sections of the multiplexed data buffer register of the first BPU to the cache memory means for storage therein, and a third and a fourth half a data word wide result bus for transmitting signals stored in different ones of said half sections of the multiplexed data buffer register of the second BPU to the cache memory means for storage therein; wherein the improvements comprise:

providing the multiplexed data buffer register of each of the BPU's with a third section for temporarily storing up to half a data word of test signals produced by each BPU, each of said third sections having a test mode of operation in which the test signals stored in the third section of the data buffer register of the first BPU is issued to the second half a data word result bus; and the test signals stored in the third section of the data buffer register of the second BPU is issued to the third half a data word result bus; and first and second half a data word wide test busses connected respectively to the second and third half a data word wide result busses, said first and second half a data word wide test busses being accessible to external test equipment; said multiplexed data buffer registers, when the BPUs are storing result signals of a double precision data manipulation operation in the cache means, being prohibited from operating in the test mode of operation; whereby no I/O terminals of the VLSI chips of said BPU's are used exclusively for issuing test signals to external test equipment.

2. In a central processor as set forth in claim 1 in which a data word consists of 40 bits.

3. In a central processor as set forth in claim 2 in which during a test mode operation of the multiplexed data buffer register means of the first and second BPU, the internal test signals applied to the second and third half a data word wide result busses and the first and second half a data word wide test buses are also stored in the cache storage means.

* * * * *